US012014691B2

(12) United States Patent
Jeon et al.

(10) Patent No.: US 12,014,691 B2
(45) Date of Patent: Jun. 18, 2024

(54) DEVICE AND METHOD FOR DRIVING DISPLAY PANEL AND DISPLAY DEVICE

(71) Applicant: LX Semicon Co., Ltd., Daejeon (KR)

(72) Inventors: Hyun Kyu Jeon, Daejeon (KR); Ji Won Lee, Daejeon (KR); Ji Hong Yuk, Daejeon (KR); Jun Hun Park, Daejeon (KR); Xin Cui, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/511,453

(22) Filed: Oct. 26, 2021

(65) Prior Publication Data

US 2022/0139336 A1 May 5, 2022

(30) Foreign Application Priority Data

Nov. 3, 2020 (KR) ........................ 10-2020-0145168

(51) Int. Cl.

| | |
|---|---|
| ***G09G 3/3291*** | (2016.01) |
| ***G09G 3/20*** | (2006.01) |
| ***H01L 27/32*** | (2006.01) |
| ***H10K 59/65*** | (2023.01) |

(52) U.S. Cl.

CPC ......... *G09G 3/3291* (2013.01); *G09G 3/2007* (2013.01); *H10K 59/65* (2023.02); *G09G 2300/0439* (2013.01); *G09G 2310/08* (2013.01); *G09G 2320/0285* (2013.01); *G09G 2320/0673* (2013.01)

(58) Field of Classification Search

CPC .............. G09G 2320/0276; G09G 2320/0233; G09G 2320/0285; G09G 2320/0673; G09G 3/2009; G09G 3/2074; G09G 2340/02; G09G 2340/04; G09G 2340/0407; G09G 2360/02; G09G 5/005; G09G 5/006; G09G 5/02

See application file for complete search history.

(56) References Cited

U.S. PATENT DOCUMENTS

| | | | | |
|---|---|---|---|---|
| 7,034,866 | B1 | 4/2006 | Colmenarez et al. | |
| 9,881,562 | B2 | 1/2018 | Lee et al. | |
| 2003/0122754 | A1* | 7/2003 | Bu | G09G 3/3607 348/E9.054 |
| 2008/0018800 | A1* | 1/2008 | Kodavalla | H04N 5/202 345/596 |
| 2016/0019849 | A1* | 1/2016 | Chang | G09G 3/3607 345/88 |
| 2016/0217750 | A1 | 7/2016 | Lee et al. | |
| 2020/0213514 | A1* | 7/2020 | Kim | G02B 27/62 |
| 2020/0234634 | A1* | 7/2020 | Li | G09G 3/3208 |

(Continued)

FOREIGN PATENT DOCUMENTS

| | | | |
|---|---|---|---|
| KR | 10-2016-0091514 | A | 8/2016 |
| KR | 10-2020-0102032 | A | 8/2020 |
| KR | 10-2021-0022131 | A | 3/2021 |

*Primary Examiner* — Dong Hui Liang
(74) *Attorney, Agent, or Firm* — ROTHWELL, FIGG, ERNST & MANBECK, P.C.

(57) ABSTRACT

In a case when a camera is disposed under a display panel, a bounded part between a camera area and a surrounding area may have a brightness difference due to a difference in pixel disposition density. The present disclosure allows minimizing such a boundary effect by compensating for greyscale values of pixels in the bounded part.

16 Claims, 8 Drawing Sheets

(56) References Cited

U.S. PATENT DOCUMENTS

| | | | | |
|---|---|---|---|---|
| 2020/0265779 | A1 | 8/2020 | In | |
| 2021/0049945 | A1* | 2/2021 | Bae | G09G 3/20 |
| 2021/0065625 | A1* | 3/2021 | Wang | G09G 3/3233 |
| 2021/0082373 | A1 | 3/2021 | Lou | |
| 2021/0091147 | A1* | 3/2021 | Liu | H01L 51/5206 |
| 2021/0358379 | A1* | 11/2021 | Li | H01L 27/326 |
| 2022/0068219 | A1* | 3/2022 | Yoo | G09G 3/3275 |

* cited by examiner

DEVICE AND METHOD FOR DRIVING DISPLAY PANEL AND DISPLAY DEVICE

CROSS REFERENCE TO RELATED APPLICATION

This application claims priority from Republic of Korea Patent Application No. 10-2020-0145168, filed on Nov. 3, 2020, which is hereby incorporated by reference in its entirety.

BACKGROUND

1. Field of Technology

The present disclosure relates to a technology for driving a display panel.

2. Description of the Prior Art

Display devices with built-in cameras are being developed in various types. Recently, a display device is equipped with a front camera for taking pictures in a front side direction of the display device as well as a rear camera for taking pictures in a back side direction of the display device. In some cases, a display device may be equipped with a short distance camera, a middle distance cameral, and a long distance camera according to the photographic range.

Researchers focus on increasing the performance of a rear camera of a display device, whereas they focus on minimizing screen covering with regard to a front camera.

Some researchers have made a part of a display panel in a form of a notch and disposed a front camera in the notch part in order to maximize the area of the display panel by minimizing the screen covering by the front camera. However, since the desire to extend a display panel up to a notch part is increasing, an under display camera (UDC) technology, in which a camera is disposed in the back side of a display panel, has recently appeared.

According to the UDC technology, a camera is disposed in the back side of an area of a display panel. Such an area is made of a light penetrating material and comprises pixels disposed in low density. Since an area comprises pixels disposed differently from those in the other area according to the UDC technology, the display panel needs to be driven reflecting such a difference in disposition of pixels.

SUMMARY OF THE INVENTION

In this background, an aspect of the present disclosure is to provide a technology for driving a display panel optimized for being used with the UDC technology. Another aspect of the present disclosure is to provide a technology for driving a display panel adopting the UDC technology, in which pixels are disposed differently in their densities in a camera area and the other area, such that a difference in a pixel disposition density does not lead to a boundary effect. Still another aspect of the present disclosure is to provide a technology for preventing an excessive increase of a memory requirement in order to obtain the aforementioned objective.

To this end, in an aspect, the present disclosure provides a device for driving a display panel comprising a first area, through which an incident light for a camera may pass, comprising pixels disposed in a low density and a second area comprising pixels disposed in a density higher than that of the first area, the device comprising: a gamma correction circuit to correct greyscale values of pixels in the first area and the second area respectively according to different gamma curves; and a boundary compensation circuit to supplementally compensate for greyscale values of pixels in a bounded part between the first area and the second area in order to reduce a boundary effect due to use of the different gamma curves.

Each pixel may comprise an organic light emitting diode (OLED). Pixels disposed in the first area may comprise OLEDs, each comprising an anode made of a transparent material and pixels disposed in the second area may comprise OLEDs, each comprising an anode made of an opaque material.

The pixel disposition density in the second area may be 4 times higher than that in the first area.

The gamma correction circuit may perform a digital gamma correction for the greyscale values of the pixels in the first area and the second area by data processing.

The different gamma curves may be stored in a form of a lookup table.

The display panel driving device may be a data driving device to control brightness of each pixel according to a greyscale value thereof and further comprise a communication circuit to transmit image data including greyscale values of the pixels of the first area and the second area.

In another aspect, the present disclosure provides a display device comprising: a data processing device to perform a digital gamma correction for greyscale values of pixels in a first area and a second area of a display panel according to different gamma curves and to supplementally compensate for greyscale values of pixels in a bounded part between the first area and the second area in order to reduce a boundary effect due to use of the different gamma curves; and a data driving device to generate a data voltage corresponding to a greyscale value of each pixel and to control brightness of the pixel according to the data voltage, wherein the first area, through which camera incident light can pass, comprises pixels disposed in a low density and the second area comprises pixels disposed in a density higher than that of the first area.

Each pixel may emit light in a front side direction of the display panel and a camera may be disposed in a back side of the first area of the display panel.

In still another aspect, a method of driving a display panel comprising a first area and a second area having different pixel disposition densities, the method comprising: dividing a bounded part between the first area and the second area into a plurality of sub-areas; storing representative compensation parameter values corresponding to a plurality of representative greyscale values by sub-area; and compensating for greyscale values of pixels in the bounded part according to the representative compensation parameter values for respective sub-areas.

The sub-areas may be differentiated by distances and directions from a boundary line between the first area and the second area.

In still another aspect, a method of driving a display panel comprising a first area, through which a camera incident light can pass, comprising pixels disposed in a low density and a second area comprising pixels in a density higher than that of the first area, the method comprising: performing a digital gamma correction for greyscale values of pixels in the first area and the second area according to different gamma curves; and supplementally compensating for greyscale values of pixels in a bounded part between the first area and the second area in order to reduce a boundary effect due to use of the different gamma curves.

As described above, the present disclosure allows driving a display panel to be optimized for the UDC technology. Even in a circumstance where pixel disposition densities are different in a camera area and a surrounding area according to the UDC technology, the present disclosure allows preventing a boundary effect due to a difference in pixel disposition densities. In addition, the present disclosure allows creating the aforementioned effects without excessively increasing a memory requirement.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE EXEMPLARY EMBODIMENTS

Figure 1:
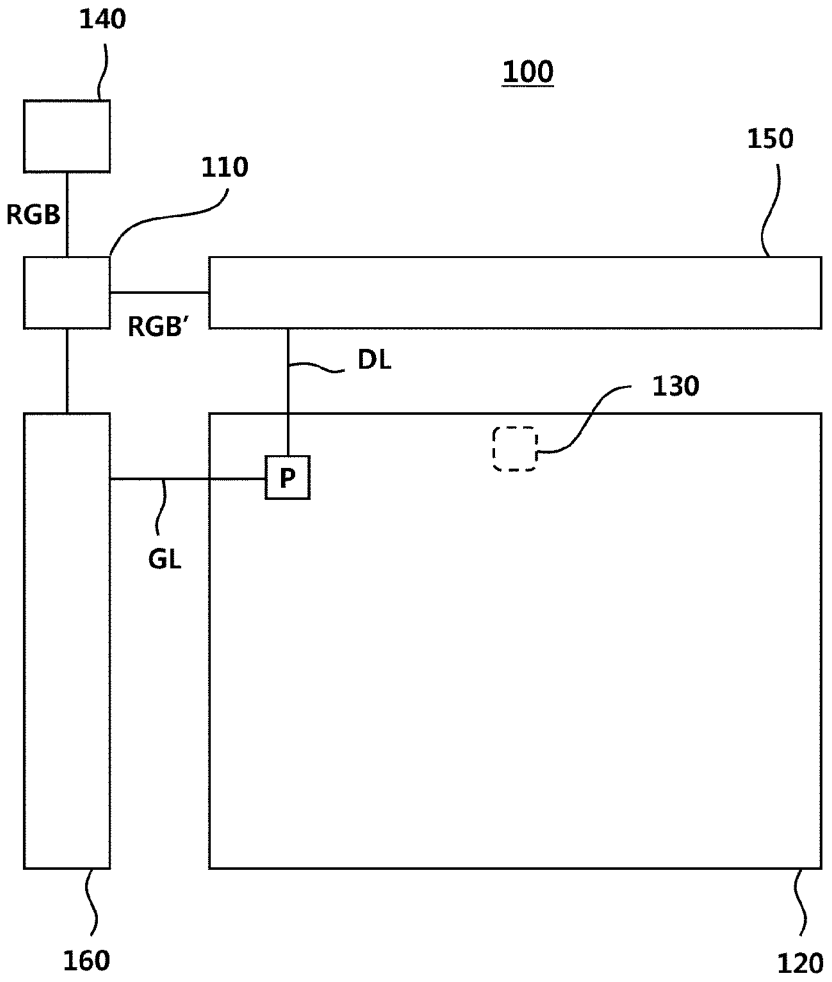
FIG. 1 is a configuration diagram of a display device according to an embodiment.

FIG. 1 is a configuration diagram of a display device according to an embodiment.

Referring to FIG. 1, a display device 100 may comprise a data processing device 110, a display panel 120, a camera 130, a host device 140, a data driving device 150, and a gate driving device 160.

The host device 140 may generate image data RGB and transmit the image data RGB to the data processing device 110.

The image data RGB may comprise a greyscale value of a pixel disposed in the display panel 120. Pixels may be divided into red (R) pixels, green (G) pixels, blue (B) pixels, or the like according to colors of emitted lights and comprise organic light emitting diodes OLEDs, light emitting diodes LEDs, liquid crystals LCs, or the like.

The data processing device 110 may correct the image data RGB to be suitable for characteristics of the display panel 120 and transmit corrected image data RGB' to the data driving device 150.

The data processing device 110 may perform a digital gamma correction for a greyscale value of each pixel according to a gamma curve. A greyscale value may be corrected by an analog circuit or by data processing. A digital gamma correction corresponds to a correction by data processing.

Assuming a gamma curve, the data processing device 110 may find a value corresponding to a greyscale value of each pixel in the gamma curve and determine the value as a corrected greyscale value. The data processing device 110 may store a gamma curve in a form of a lookup table or in a form of an equation.

The data processing device 110 may transmit the corrected image data RGB' to the data driving device 150. In addition, the data processing device 110 may transmit various control signals to the data driving device 150. The various control signals may comprise a timing control signal. The data processing device 110 may be referred to as a timing controller TCON in terms that it generates such a signal.

The data driving device 150 may receive the corrected image data RGB' and generate a data voltage corresponding to the greyscale value of each pixel included in the corrected image data RGB'. In addition, the data driving device 150 may control the brightness of each pixel according to the data voltage.

In the display panel 120, gate lines GL and data lines DL may be disposed in a form of a matrix. A pixel may be formed at every point where a gate line GL and a data line DL intersect with each other.

The gate driving device 160 may supply a scan signal to a gate line GL. When a scan signal of a turn-on level is supplied to a gate line, a pixel P corresponding to the gate line GL may be connected with a data line DL. The data driving device 150 may supply a data voltage to the data line DL. In this way, the data voltage may be transmitted to the pixel P. The brightness of the pixel P may be controlled to be different according to the level of the data voltage. Generally, when the level of a data voltage is high, the brightness of a pixel P may be high and, when the level of a data voltage is low, the brightness of a pixel P may be low.

Devices for driving the display panel 120 may comprise the aforementioned data processing device 110, data driving device 150, and gate driving device 160. A display panel driving device may be implemented in a form of an integrated circuit. For example, a data processing device 110, a data driving device 150, and a gate driving device 160 may respectively be implemented as separate integrated circuits or a data processing device 110 and a data driving device 150 may be implemented in a form of a combined integrated circuit.

Pixels P are disposed in the display panel 120 and a camera 130 may be disposed in a back side of an area of the display panel 120. For the convenience of description, hereinafter, a side where pixels P emit lights will be referred to as a front side of the display panel 120 and its opposite side will be referred to as a back side of the display panel 120.

Since the camera 130 is disposed in the back side of the display panel 120, a user might not be aware of the presence of the camera. The user may perceive all of the front side of the display panel 120 as a display area.

An incident light for the camera may be transmitted to the camera 130 by passing through an area of the display panel 120. In order to increase an amount of light transmission, the area of the display panel 120, where the camera 130 is disposed, may be made of a light penetrating material through which light passes to the back side and may comprise pixels P disposed in a low density.

Figure 2:
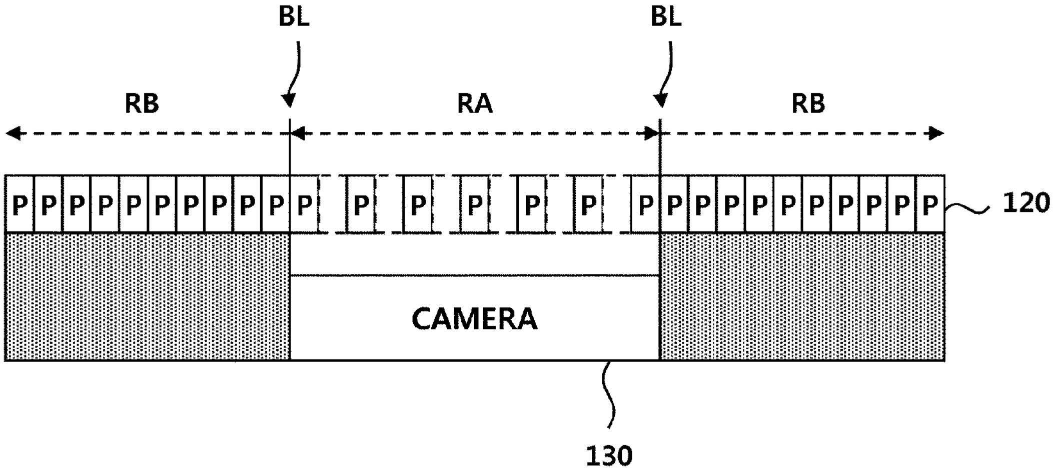
FIG. 2 is a cross-sectional diagram of a display panel according to an embodiment.
Figure 3:
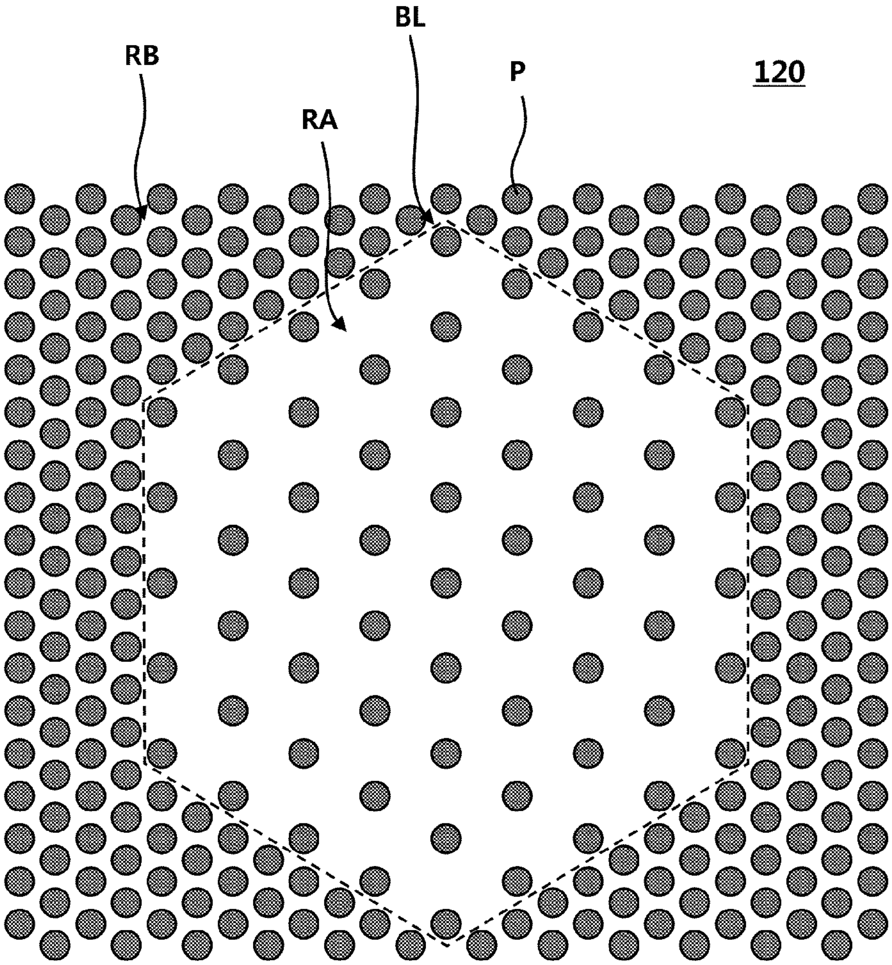
FIG. 3 is a frontal diagram of a display panel according to an embodiment.

FIG. 2 is a cross-sectional diagram of a display panel according to an embodiment and FIG. 3 is a frontal diagram of a display panel according to an embodiment.

Referring to FIG. 2 and FIG. 3, the display panel 120 may comprise a first area RA and a second area RB, which respectively comprise pixels disposed in different densities.

The camera 130 may be disposed in a back side of the first area RA and an incident light for the camera 130 may pass through the first area RA. The first area RA of the display panel 120 may be made of a light penetrating material. For example, in a case when a pixel P comprises an OLED, an anode and a cathode of the OLED may be made of a transparent material. On the contrary, the second area RB may comprise a non-light-penetrating layer through which light does not pass to the back side of the display panel 120. For example, in a case when a pixel P comprises an OLED, an anode of the OLED may be made of an opaque material.

The first area RA may have a shape of a hexagon, a circle, a rectangle, an oval, or a notch.

Pixels P may be disposed in the first area RA in a low density and in the second area RB in a relatively high density. For example, disposition intervals between pixels P in the first area RA may be twice the size of the disposition intervals between pixels P in the second area RB. In this case, a disposition density of the pixels P in the first area RA may be four times lower than a disposition density of the pixels P in the second area RB.

In order to prevent that an image looks dark in the first area RA of the display device due to a low density of a disposition of the pixels P, greyscale values of the pixels P in the first area RA may be increased. However, if the greyscale values of the pixels P in the first area RA are uniformly increased, a bounded part between the first area RA and the second area RB may have a brightness higher than that of the other parts and this may lead to a boundary effect in which an unintentional boundary line BL is perceived.

To resolve such a problem, in the display device according to an embodiment, the greyscale values of the pixels P in the bounded part between the first area RA and the second area RB may supplementally be compensated after a digital gamma correction for image data.

Figure 4:
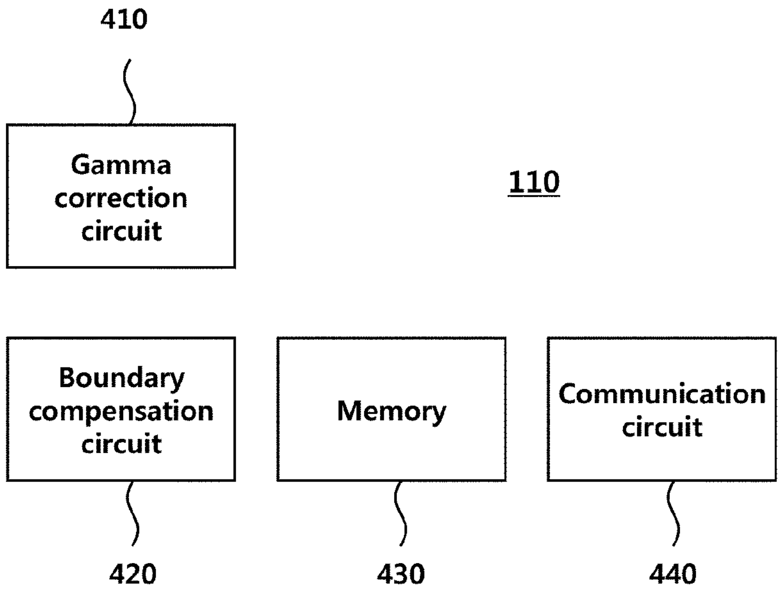
FIG. 4 is a configuration diagram of a data processing device according to an embodiment.

FIG. 4 is a configuration diagram of a data processing device according to an embodiment.

Referring to FIG. 4, the data processing device 110 may comprise a gamma correction circuit 410, a boundary compensation circuit 420, a memory 430, and a communication circuit 440.

The communication circuit 440 may receive image data from the host device, transmit corrected image data to the data driving device, and transmit or receive various information or various signals to or from other devices.

The memory 430 may store image data, gamma curve information, and boundary compensation information.

The gamma curve information may include information about a plurality of gamma curves used for digital gamma corrections. Information about a first gamma curve for pixels in the first area of the display panel and information about a second gamma curve for pixels in the second area thereof may be stored.

The boundary compensation information may include compensation parameter values for greyscale values of pixels in the bounded part between the first area and the second area of the display panel. The bounded part may be divided into a plurality of sub-areas and the compensation parameter values may be stored by sub-area or by color.

The gamma correction circuit 410 may perform a digital gamma correction for a greyscale value of each pixel according to a gamma curve.

The gamma correction circuit 410 may perform digital gamma corrections for greyscale values of pixels in different areas according to different gamma curves depending on areas. The gamma correction circuit 410 may perform digital gamma corrections for greyscale values of pixels in the first area according to the first gamma curve and perform digital gamma corrections for greyscale values of pixels in the second area according to the second gamma curve.

A correction ratio of an output to an input of the first gamma curve applied to the first area may be higher than a correction ratio of an output to an input of the second gamma curve applied to the second area. For example, an output greyscale value corresponding to an input greyscale value of 128 in the second gamma curve may be 130, whereas an output greyscale value corresponding to the same input greyscale value, which is 128, may be 150, which is higher than 130.

Pixels may be disposed in a same density in the first area and the gamma correction circuit 410 may perform digital gamma corrections by uniformly applying the first gamma curve to all the pixels in the first area.

The boundary compensation circuit 420 may supplementally compensate for greyscale values of pixels in the bounded part between the first area and the second area so as to reduce the boundary effect caused by using different gamma curves. For example, the boundary compensation circuit 420 may compensate for greyscale values of pixels belonging to the first area in the bounded part so that these greyscale values become low. Otherwise, the boundary compensation circuit 420 may compensate for greyscale values of pixels belonging to the second area in the bounded part so that these greyscale values become high.

The bounded part may be divided into a plurality of sub-areas and the boundary compensation circuit 420 may apply different compensation parameter values for the respective sub-areas.

Figure 5:
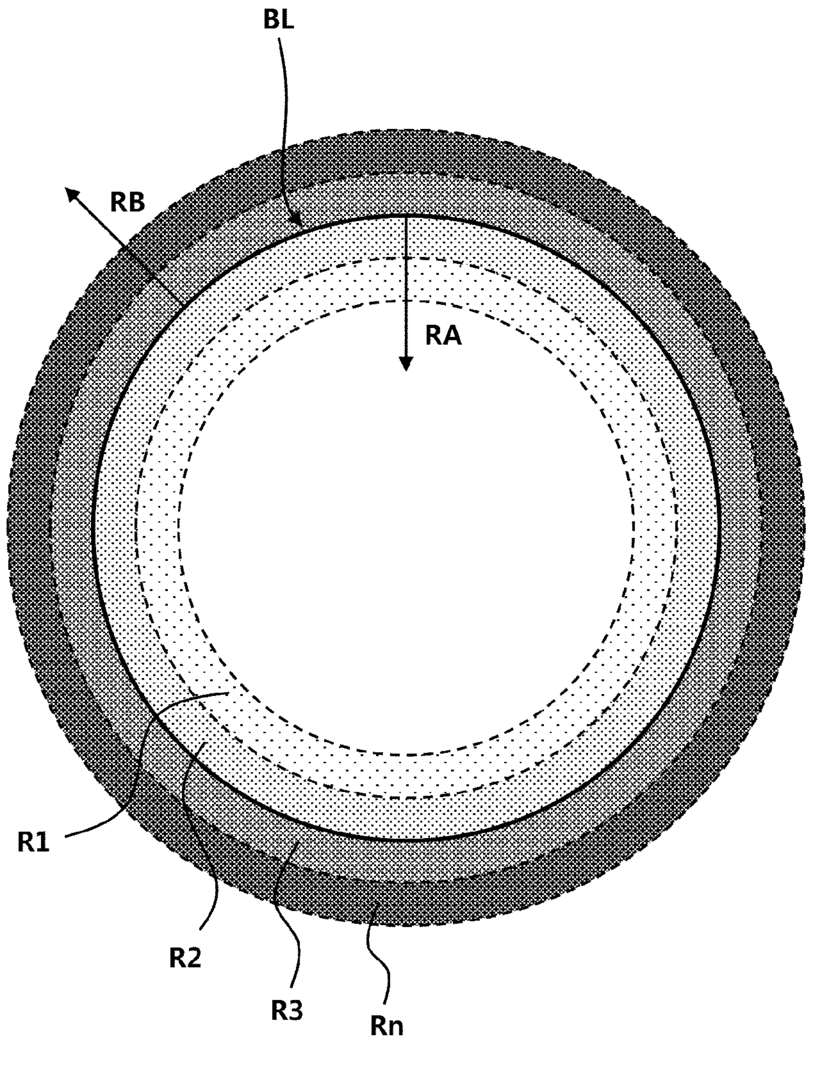
FIG. 5 is an exemplary diagram of sub-areas according to an embodiment.

FIG. 5 is an exemplary diagram of sub-areas according to an embodiment.

Referring to FIG. 5, a part within a predetermined distance from a boundary line BL between the first area RA and the second area RB may be defined as a bounded part and the bounded part may be divided into a plurality of sub-areas R1~Rn (n is a natural number equal to or higher than 2).

A part of the bounded part may be located in the first area, which is inside the boundary line BL and the rest thereof may be located in the second area RB, which is outside the boundary line BL. Even though FIG. 5 shows four sub-areas R1~Rn for the convenience of description, the number of sub-areas may be greater or less than four depending on embodiments. In addition, even though FIG. 5 shows two sub-areas R1, R2 located inside the boundary line BL and two sub-areas R3, Rn located outside the boundary area BL for the convenience of description, different numbers of sub-areas may be located inside and outside the boundary line depending on embodiments.

The sub-areas R1~Rn may be differentiated by distances from the boundary line BL and positions with respect to the boundary line BL. For example, a second sub-area R2 may be an area located within a first distance from the boundary line inside the boundary line BL and a first sub-area R1 may be an area located outside the first distance, but within a second distance from the boundary line BL inside the boundary line BL. A third sub-area R3 is an area located within the first distance from the boundary line BL outside the boundary line BL and a fourth sub-area Rn is an area located outside the first distance, but within the second distance from the boundary line BL outside the boundary line BL.

The data processing device may store pieces of boundary compensation information for the respective sub-areas R1~Rn and the respective colors of pixels and supplementally compensate for a greyscale value of each pixel according to the boundary compensation information.

The data processing device may use all of the plurality of sub-areas R1~Rn or some of the plurality of sub-areas R1~Rn, for example, R1~R3 or R2~Rn.

The sub-areas may be classified according to the distances from the boundary line BL as described above or according to the directions. For example, the bounded part may be divided into an upper area, a lower area, a left area, and a right area, that is, four sub-areas. The bounded part may be divided according to two elements: distances and directions.

Meanwhile, the boundary compensation information may comprise compensation parameter values. The data processing device may store the compensation parameter values in a form of a lookup table or may store only representative compensation parameter values for representative greyscale values and apply an interpolation for the rest of greyscale values.

Figure 6:
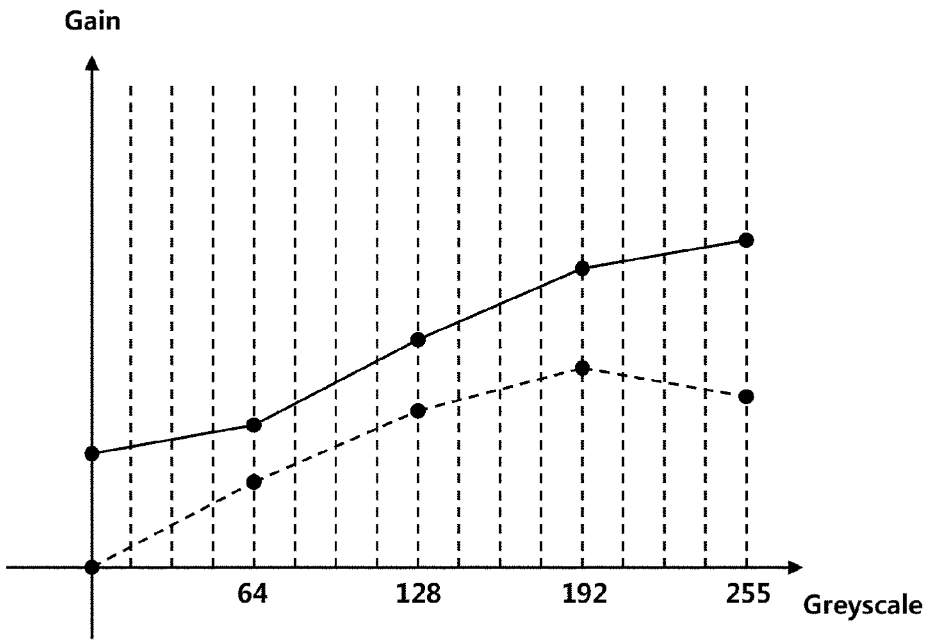
FIG. 6 is a first exemplary diagram of compensation parameter curves according to an embodiment.

FIG. 6 is a first exemplary diagram of compensation parameter curves according to an embodiment.

Referring to FIG. 6, the data processing device may determine a compensation parameter value suitable for each greyscale value according to a compensation parameter curve. The compensation parameter curve may be stored in a form of a lookup table or by storing representative compensation parameter values. Hereinafter, an example in which a compensation parameter curve is stored using representative compensation parameter values is described.

The data processing device may store representative compensation parameter values for representative greyscale values, for example, 0, 64, 128, 192, and 255. If a greyscale value of a pixel in the bounded part, which needs to be compensated, corresponds to one of the representative greyscale values, the relevant one of the stored representative compensation parameter values may be determined as a compensation parameter value for the pixel. If a greyscale value of a pixel in the bounded part, which needs to be compensated, does not correspond to one of the representative greyscale values, the data processing device may generate an interpolated compensation parameter value from the representative compensation parameter values using the interpolation and determine the interpolated compensation parameter value as a compensation parameter value for the relevant pixel.

For example, in a case when a greyscale value GS of a pixel is greater than a first representative greyscale value RGS1 and less than a second representative greyscale value RGS2, a compensation parameter value GN for the pixel may be calculated by the following equation 1.

$$GN=RGN1+(RGN2-RGN1)\times(GS-RGS1)/(RGS2-RGS1) \quad \text{[Equation 1]}$$

Here, RGN1 may be a first representative compensation parameter value corresponding to a first representative greyscale value RGS1 and RGN2 may be a second representative compensation parameter value corresponding to a second representative greyscale value RGS2.

As shown in FIG. 6, compensation parameter curves may be different depending on characteristics of display panels. For example, a compensation parameter curve represented by a solid line and a compensation parameter curve represented by a dotted line may be applied respectively to different display panels. Differences in characteristics of display panels may result from differences in light transmission in a first area and differences in structure inside pixels. A designer or a manufacturer may apply different compensation parameter curves to different display panels by changing only several (for example, 5) representative compensation parameter values stored in the data processing device.

A compensation parameter may be a gain applied to an equation for compensation. At least one compensation parameter is used for an equation for compensation and the data processing device may store compensation parameter curves for respective compensation parameters.

Figure 7:
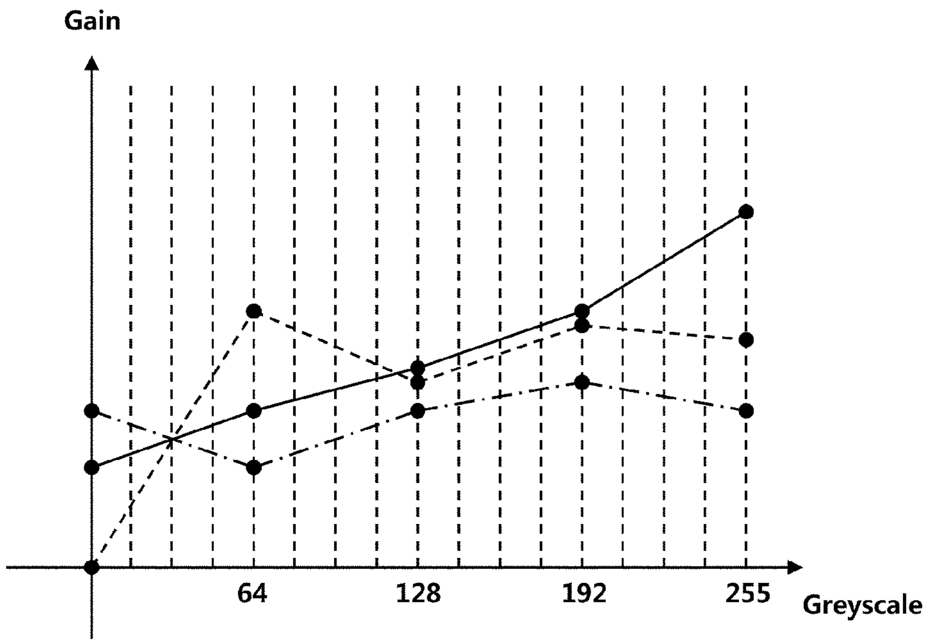
FIG. 7 is a second exemplary diagram of compensation parameter curves according to an embodiment.

FIG. 7 is a second exemplary diagram of compensation parameter curves according to an embodiment.

Referring to FIG. 7, a curve of a dotted line is an example of a compensation parameter curve for R pixels, a curve of a solid line is an example of a compensation parameter curve for G pixels, and a curve of an alternated long and short dash line is an example of a compensation parameter curve for B pixels.

The data processing device may store and use different compensation parameter curves for respective colors of pixels. A compensation parameter curve may be stored by storing representative compensation parameter values. For example, 5 representative compensation parameter values may be stored for the compensation parameter curve for R pixels, 5 representative compensation parameter values may be stored for the compensation parameter curve for G pixels, and 5 representative compensation parameter values may be stored for the compensation parameter curve for B pixels.

Figure 8:
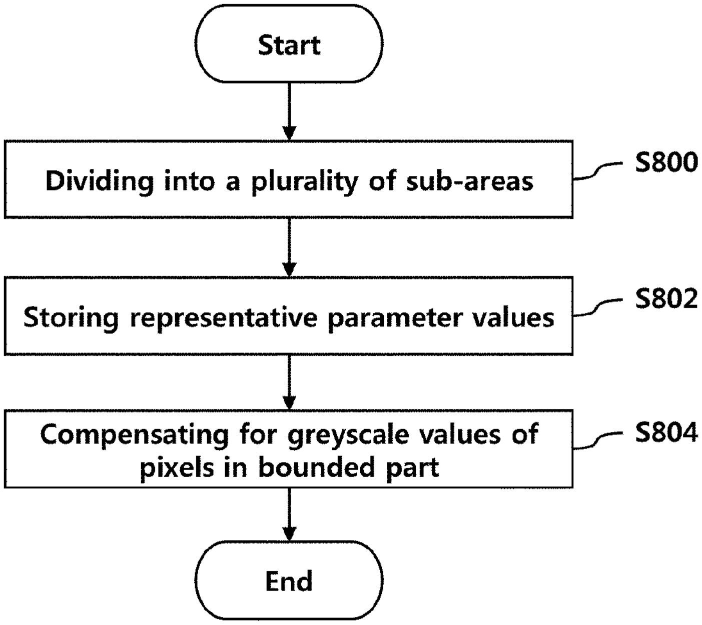
FIG. 8 is a flow diagram of a method of driving a display panel according to an embodiment.

FIG. 8 is a flow diagram of a method of driving a display panel according to an embodiment.

Referring to FIG. 8, the driving device may divide the bounded part between the first area and the second area into a plurality of sub-areas (S800). The first area and the second area may comprise pixels differently disposed in their disposition densities. The first area may comprise pixels disposed in a relatively lower density and the second area may comprise pixels disposed in a relatively higher density. A camera may be disposed in a back side of the first area of the display panel and the first area of the display panel may have a structure in which light may transmit from the front side to the back side.

The plurality of sub-areas may be located in the bounded part between the first area and the second area. Two sub-areas may be located in the first area and two sub-areas may be located in the second area. The sub-areas may be differentiated depending on distances from the boundary line between the first area and the second area or depending on positions in the display panel.

The driving device may store representative compensation parameter values corresponding to a plurality or representative greyscale values for each sub-area (S802). The representative compensation parameter values for each sub-area may be stored by pixel color.

Subsequently, the driving device may compensate for greyscale values of pixels in the bounded part between the first area and the second area according to the representative compensation parameter values for each sub-area (S804). Here, in a case when a greyscale value of a pixel is different from a representative greyscale value, the driving device may generate an interpolated compensation parameter value from representative compensation parameter values according to an interpolation method and compensate for the greyscale value using the interpolated compensation parameter value.

As described above, the present disclosure allows driving a display panel optimized for the UDC technology. Even in a circumstance where pixels are disposed in different pixel disposition densities in a camera area and a surrounding area according to the UDC technology, the present disclosure allows preventing a boundary effect due to a difference in pixel disposition densities. In addition, the present disclosure allows creating the aforementioned effects without excessively increasing a memory requirement.

What is claimed is:

1. A device for driving a display panel, the display panel comprising a first area through which an incident light for a camera may pass and a second area, wherein a density of pixels disposed in the first area is lower than a density of pixels disposed in the second area, the device comprising:

a gamma correction circuit to correct greyscale values of pixels in the first area according to a first gamma curve and grayscale values of pixels in the second area according to a second gamma curve, wherein the first and second gamma curves are different, and further wherein the first area includes a first bounded part and the second area includes a second bounded part; and a boundary compensation circuit to compensate for the gamma corrected greyscale values of pixels in the first bounded part, which are corrected according to the first gamma curve and the gamma corrected greyscale values of pixels in the second bounded part, which are corrected according to the second gamma curve, in order to reduce a boundary effect caused by use of the different gamma curves, wherein the first bounded part divided into a plurality of first sub-areas is located within a first distance from an inside of a boundary line between the first area and the second area, and the second bounded part divided into a plurality of second sub-areas is located in a second distance from an outside of the boundary line between the first area and the second area.

2. The device of claim 1, wherein the device is configured to store a plurality of representative compensation parameter values for compensating for the gamma corrected greyscale values of the pixels in the first and second bounded parts, each representative compensation parameter value included in the plurality of representative compensation parameter values is associated with each representative greyscale value included in a plurality of representative greyscale values, the device is configured to determine that a grayscale value of a pixel included in the first bounded part is not one of the plurality of representative greyscale values, and the device is further configured to, as a result of the above determination, calculate a compensation parameter value for the pixel based on at least two representative compensation parameter values associated with at least two representative greyscale values.

3. The device of claim 2, wherein the compensation parameter value for the pixel is determined based on a difference between said at least two representative compensation parameter values.

4. The device of claim 3, wherein the compensation parameter value for the pixel is determined based on a difference between the greyscale value of the pixel and one of said at least two representative greyscale values.

5. The device of claim 4, wherein the compensation parameter value for the pixel is determined based on a difference between said at least two representative greyscale values.

6. The device of claim 5, wherein $$GN=RGN1+(RGN2-RGN1)\times(GS-RGS1)/(RGS2-RGS1) \quad \text{[Equation 1]}$$

where GN is the compensation parameter value for the pixel, RGN1 is one of said at least two representative compensation parameter values, RGN2 is another one of said at least two representative compensation parameter values, GS is the greyscale value of the pixel, RGS1 is one of said at least two representative greyscale values, and RGS2 is another one of said at least two representative greyscale values.

7. The device of claim 1, wherein a compensation ratio of an output to an input of a first gamma curve applied to the first area is higher than a compensation ratio of an output to an input of a second gamma curve applied to the second area.

8. The device of claim 7, wherein the boundary compensation circuit is configured to compensate for greyscale values of pixels in the first bounded part such that the greyscale values become lower.

9. The device of claim 1, wherein representative compensation parameter values corresponding to a plurality of representative greyscale values are stored for the respective sub-areas, and the boundary compensation circuit is configured to compensate for greyscale values of pixels in the first bounded part and/or the second bounded part according to the representative compensation parameter values for the respective sub-areas.

10. The device of claim 1, wherein each pixel comprises an organic light emitting diode (OLED), the pixels disposed in the first area comprise OLEDs, each of the OLED in the first area comprises an anode made of a transparent material, the pixels disposed in the second area comprise OLEDs, and each of the OLED in the second area comprises an anode made of an opaque material.

11. The device of claim 1, wherein the pixel disposition density in the second area is 4 times higher than that in the first area, and/or the gamma correction circuit is configured to perform a digital gamma correction for the greyscale values of the pixels in the first area and the second area by data processing.

12. The device of claim 1, wherein the different gamma curves are stored in a form of a lookup table.

13. The device of claim 1, wherein the display panel driving device is a data driving device to control brightness of each pixel according to a greyscale value thereof and further comprises a communication circuit to transmit image data including greyscale values of the pixels of the first area and the second area.

14. A display device comprising:

a data processing device to perform a digital gamma correction for greyscale values of pixels in a first area of a display panel according to a first gamma curve and greyscale values of pixels in a second area of the display panel according to a second gamma curve, wherein the first and second gamma curves are different, wherein the first area includes a first bounded part and the second area includes a second bounded part, and further wherein the data processing device is configured to compensate for the gamma corrected greyscale values of pixels in the first bounded part, which are corrected according to the first gamma curve and the gamma corrected greyscale values of pixels in the second bounded part, which are corrected according to the second gamma curve, in order to reduce a boundary effect caused by use of the different gamma curves; and a data driving device to generate a data voltage corresponding to a greyscale value of each pixel and to control brightness of the pixel according to the data voltage, wherein a density of pixels disposed in the first area through which an incident light for a camera can pass is lower than a density of pixels disposed in the second area, the first bounded part divided into a plurality of first sub-areas is located within a first distance from an inside of a boundary line between the first area and the second area, and the second bounded part divided into a plurality of second sub-areas is located in a second distance from an outside of the boundary line between the first area and the second area.

15. The display device of claim 14, wherein the data processing device is configured to receive image data including a greyscale value of each pixel from a host device and is configured to transmit the image data, which has been subject to a digital gamma correction according to a gamma curve, to the data driving device.

16. The display device of claim 14, wherein each pixel is configured to emit light in a front side direction of the display panel and a camera is disposed in a back side of the first area of the display panel.

* * * * *